US009153709B2

(12) United States Patent
Lin

(10) Patent No.: US 9,153,709 B2
(45) Date of Patent: Oct. 6, 2015

(54) JUNCTION BOX, POWER SYSTEM AND METHOD FOR CONTROLLING THE SAME

(75) Inventor: Chien-chih Lin, Taipei (TW)

(73) Assignee: GENESYS LOGIC, INC., Shindian, Taipei (TW)

( * ) Notice: Subject to any disclaimer, the term of this patent is extended or adjusted under 35 U.S.C. 154(b) by 485 days.

(21) Appl. No.: 13/548,124

(22) Filed: Jul. 12, 2012

(65) Prior Publication Data

US 2013/0120953 A1 May 16, 2013

(30) Foreign Application Priority Data

Nov. 16, 2011 (TW) .............................. 100141864 A

(51) Int. Cl.
*H05K 7/02* (2006.01)
*H01L 31/02* (2006.01)

(52) U.S. Cl.
CPC .......... *H01L 31/02021* (2013.01); *Y02E 10/50* (2013.01)

(58) Field of Classification Search
CPC ....... Y02E 10/50; Y02E 10/563; Y02E 10/47; Y02E 10/52; Y02E 10/58; Y02E 10/60; Y02E 10/763; Y02E 60/721; H01L 31/02021; H01L 27/1421; H01L 31/0504; H01L 31/0201; H01L 31/048; H01L 31/0481; H01L 31/05; H01L 31/02008; H01L 31/0485; H01L 31/076; H02S 20/00; H01M 10/502; H02J 1/00; H02J 3/38; H02J 3/00; Y02B 10/12; F21V 23/06; F21V 15/01; F21V 23/02; F21V 23/023; F21V 23/04; B60L 11/18; F24J 2/5211; G05B 15/02; G05B 19/4185; G06F 1/26; H05K 5/0247
USPC ................ 361/807, 752, 728, 622, 736, 819; 174/58, 535, 50.52, 50; 136/244, 251
See application file for complete search history.

(56) References Cited

U.S. PATENT DOCUMENTS

| | | | |
|---|---|---|---|
| 6,181,101 B1* | 1/2001 | Arai et al. ..................... | 320/104 |
| 2010/0127570 A1* | 5/2010 | Hadar et al. ..................... | 307/77 |
| 2010/0139734 A1* | 6/2010 | Hadar et al. .................. | 136/244 |
| 2011/0031814 A1* | 2/2011 | Giesler ........................... | 307/77 |

(Continued)

FOREIGN PATENT DOCUMENTS

| | | |
|---|---|---|
| CN | 1199935 | 11/1998 |
| CN | 101331644 | 12/2008 |

(Continued)

*Primary Examiner* — Hung S Bui
*Assistant Examiner* — Michael Matey

(57) ABSTRACT

A junction box for connecting a power supply unit is disclosed. The junction box includes a first connection terminal, a second connection terminal, a first signal connection terminal, a second signal connection terminal, and a switching module. The first and second connection terminals are utilized to transmit a DC power provided by the power supply unit. The first and second signal connection terminals are utilized to transmit a control signal. The switching module controls the electrically coupling relationship between the first connection terminal and the second terminal according to the control signal. A power system which employs the junction boxes and a method for controlling the power system are also disclosed.

11 Claims, 4 Drawing Sheets

(56) References Cited

U.S. PATENT DOCUMENTS

| | | | |
|---|---|---|---|
| 2011/0079263 A1* | 4/2011 | Avrutsky | 136/244 |
| 2011/0088741 A1* | 4/2011 | Dunton et al. | 136/244 |
| 2012/0055529 A1* | 3/2012 | Hung et al. | 136/244 |
| 2012/0055530 A1* | 3/2012 | Ger et al. | 136/244 |
| 2012/0140380 A1* | 6/2012 | Lin | 361/622 |
| 2012/0161526 A1* | 6/2012 | Huang et al. | 307/77 |
| 2012/0306289 A1* | 12/2012 | Pozsgay | 307/131 |
| 2012/0316802 A1* | 12/2012 | Presher et al. | 702/58 |
| 2014/0301003 A1* | 10/2014 | Jankowski | 361/57 |

FOREIGN PATENT DOCUMENTS

| | | |
|---|---|---|
| CN | 101939660 | 1/2011 |
| TW | 390546 | 10/2010 |

\* cited by examiner

JUNCTION BOX, POWER SYSTEM AND METHOD FOR CONTROLLING THE SAME

FIELD OF THE INVENTION

The present invention relates to a junction box and a method thereof, and especially to a junction box for connecting a power supply unit, a power system with the junction box, and a control method thereof.

BACKGROUND OF THE INVENTION

Solar energy is a pollution-free, safe renewable energy, and there is a considerable development potential. In particular, it is the current trend of energy conservation that solar cells are integrated into building materials. For instance, solar photovoltaic panels are utilized to replace the roof materials, exterior walls, or building glasses of constructions. However, because the voltage generated by a single solar photovoltaic panel is very small, a plurality of solar photovoltaic panels is often connected serially via the junction boxes for forming a larger voltage to be used.

The conventional junction box is a small box which includes a plurality of Schottky diodes and two external cables with a cathode connector and an anode connector. A conventional solar photovoltaic system is composed of a plurality of solar photovoltaic panels, a high-voltage breaker and an inverter, in which the solar photovoltaic panels are connected in serial connections via anode and cathode connectors of the junction boxes to form a terminal voltage of several hundred volts.

However, once an exception or a fire accident has occurred in the conventional solar photovoltaic system, the direct current (DC) high-voltage power becomes a difficult problem to put out a fire because the continuously DC high-voltage power under natural sunshine results in death or injury to a fireman due to an electric shock thereof.

For instance, a solar energy system with N solar photovoltaic panels has N+1 electrical access points that the anode connector is connected to the cathode connector. In order to avoid that the DC high voltage occurs at any electrical access points, the best way is to disconnect all the N+1 electrical access points. However, when a fire occurs, it is indeed difficult to disconnect a large number of the electrical access points safely and quickly for implementing a fire fighting. Currently, the only way is to isolate it from other combustibles and then leave the fire to burn the solar photovoltaic panels out, but the fire on the roof may burn into the building to cause serious damage.

In the field of electric vehicles, the power system has also a number of battery cells connected in serial connections for supplying power to the vehicle. When a vehicle failure or overheat occurs in the vehicle, the vehicle on fire often occurs. At this point, the traditional way of the fire fighting will also have the same problem of the electric shock.

SUMMARY OF THE INVENTION

Accordingly, an objective of the present invention is to provide a junction box which is connected to a power supply unit of a power system for controlling the transmission of a DC power which is provided from the power supply unit.

Another objective of the present invention is to provide a power system which can de-serialize each junction box of the power supply unit.

Still another objective of the present invention is to provide a method for controlling the power system and controlling series each junction box of the power supply unit to serialize and de-serialize.

To achieve the foregoing objective, according to an aspect of the present invention, a junction box which is connected to a power supply unit of a power system is provided. The junction box includes a first connection terminal, a second connection terminal, at least one bypass diode (Bypass Diode), a first signal connection terminal, a second signal connection terminal, and a switch module. The first connection terminal and the second connection terminal herein are used for transmitting a DC power provided by the power supply unit. The at least one bypass diode is electrically coupled to the power supply unit. The first signal connection terminal and the second signal connection terminal are used for transmitting a control signal. The switch module is electrically coupled between the first signal connection terminal and the second signal connection terminal, and the switch module controls an electrically coupling relationship between the first connection terminal and the second connection terminal according to the control signal.

In one preferred embodiment, the junction box further comprises a power supply circuit. The power supply circuit is electrically coupled to the power supply unit, and the power supply circuit is utilized to provide the control signal. Preferably, the power supply circuit is a current-limiting circuit which is electrically coupled to the first signal connection terminal, and the current-limiting circuit is utilized for generating a predetermined current to the first signal connection terminal. A magnitude of the predetermined current is either less than or equal to a predetermined value.

In the above-mentioned preferred embodiment, the switch module includes a photoelectric switch and a power switch. The photoelectric switch is disposed between the first signal connection terminal and the second signal connection terminal. The power switch is electrically coupled to the first connection terminal and the second connection terminal, and used for controlling connection and disconnection between the power supply unit and the first connection terminal as well as the power supply unit and the second connection terminal. The photoelectric switch herein is driven by the predetermined current. Preferably, the power switch is either a relay circuit or a field effect transistor circuit.

In accordance with the junction box of the embodiment, except for the switch module being capable of serializing and de-serializing, the switch module can be controlled without extra power through the power supply unit generating the power of control signal.

The power system provided from the present invention comprising a plurality of power supply units, a plurality of junction boxes in serial connections, a manual breaker, and a control wire. The junction boxes are electrically coupled respectively to the power supply units, and a first one and a last one of the junction boxes respectively coupled to a low potential line and a high potential line. Each junction box includes a first signal connection terminal, a second signal connection terminal, and a switch module which is electrically coupled between the first signal connection terminal and the second signal connection terminal. The first signal connection terminal and the second signal connection terminal are connected to the second signal connection terminal and the first signal connection terminal of the adjacent junction box in serial connections for transmitting a control signal which is powered by the power supply unit.

The manual breaker is electrically coupled to ends of the low potential line and the high potential line for simultaneously connecting or disconnecting the low potential line and the high potential line. One end of the control wire is electrically coupled to the first signal connection terminal of the last junction box, and an opposite end of the control wire is electrically coupled to the low potential line behind the manual breaker. The control wire turns on or turns off a transmission of the control signal according to the manual breaker. The switch module herein controls a serialization or a de-serialization of the junction boxes according to the transmission of the control signal.

In one preferred embodiment, the control wire turns off the transmission of the control signal to de-serialize the junction boxes when the low potential line is disconnected by the manual breaker. The control wire turns on the transmission of the control signal to serialize the junction boxes when the low potential line is connected by the manual breaker.

In one preferred embodiment, the control signal is provided by the first junction box. In addition, the first junction box is a master junction box, and remaining of the junction boxes are slave junction boxes, the master junction box dispatches the control signal to the slave junction boxes. The first junction box further comprises a power supply circuit. The power supply circuit is electrically coupled to the power supply unit which is coupled to the first junction box, and the power supply circuit is utilized to provide the control signal. Preferably, the power supply circuit is a current-limiting circuit which is electrically coupled to the first signal connection terminal, and the current-limiting circuit is utilized for generating a predetermined current to the first signal connection terminal.

In the above-mentioned preferred embodiment, each switch module includes a photoelectric switch and a power switch. The photoelectric switch is disposed between the first signal connection terminal and the second signal connection terminal. The power switch is utilized to control the serialization or the de-serialization of the corresponding junction box according to an on/off state of the photoelectric switch. The photoelectric switch herein is driven by the predetermined current. Similarly, the power switch is either a relay circuit or a field effect transistor circuit.

In accordance with the power system of the present invention, the above-mentioned junction boxes of the present invention is utilized, and the first junction box is set as the master junction box for dispatching the control signal, and remaining of the junction boxes are slave junction boxes. The switch module within the junction box controls to de-serialize or serialize according to whether the control wire is conducted.

A method for controlling the power system is further provided in the present invention, the power system includes a plurality of power supply units, a plurality of junction boxes in serial connections, and a manual breaker. The first one and the last one of the junction boxes are respectively coupled to a low potential line and a high potential line. Each junction box includes a first signal connection terminal, a second signal connection terminal, and a switch module. The first signal connection terminal and the second signal connection terminal are connected to the second signal connection terminal and the first signal connection terminal of the adjacent junction box in serial connections for transmitting a control signal. The manual breaker is electrically coupled to ends of the low potential line and the high potential line. The method includes the steps of:

(1) providing a control wire for one end of the control wire being electrically coupled to the first signal connection terminal of the last junction box and for an opposite end of the control wire being electrically coupled to the low potential line behind the manual breaker;

(2) providing the control signal by the first junction box through the corresponding power supply unit;

(3) either connecting or disconnecting the coupling between the control wire and the low potential line; and (4) controlling either a serialization or a de-serialization of the junction boxes by the switch module according to the transmission of the control signal.

In one preferred embodiment of the present invention, when the coupling between the control wire and the low potential line is disconnected in the step (3), the control wire is at a floating state for stopping transmitting the control signal so as to de-serialize. When the coupling between the control wire and the low potential line is connected in the step (3), the control wire is grounded for transmitting the control signal to each of the junction boxes so as to serialize.

In accordance with the control method of the power system in the present invention, the above-mentioned power system of the present invention is utilized, and the manual breaker can be utilized to connect or disconnect the control wire so as to simultaneously de-serialize each of the junction boxes. Accordingly, the serial connections of each the power supply unit can be de-serialized in case of a fire, thereby reducing property damage.

DETAILED DESCRIPTION OF THE PREFERRED EMBODIMENTS

Figure 1:
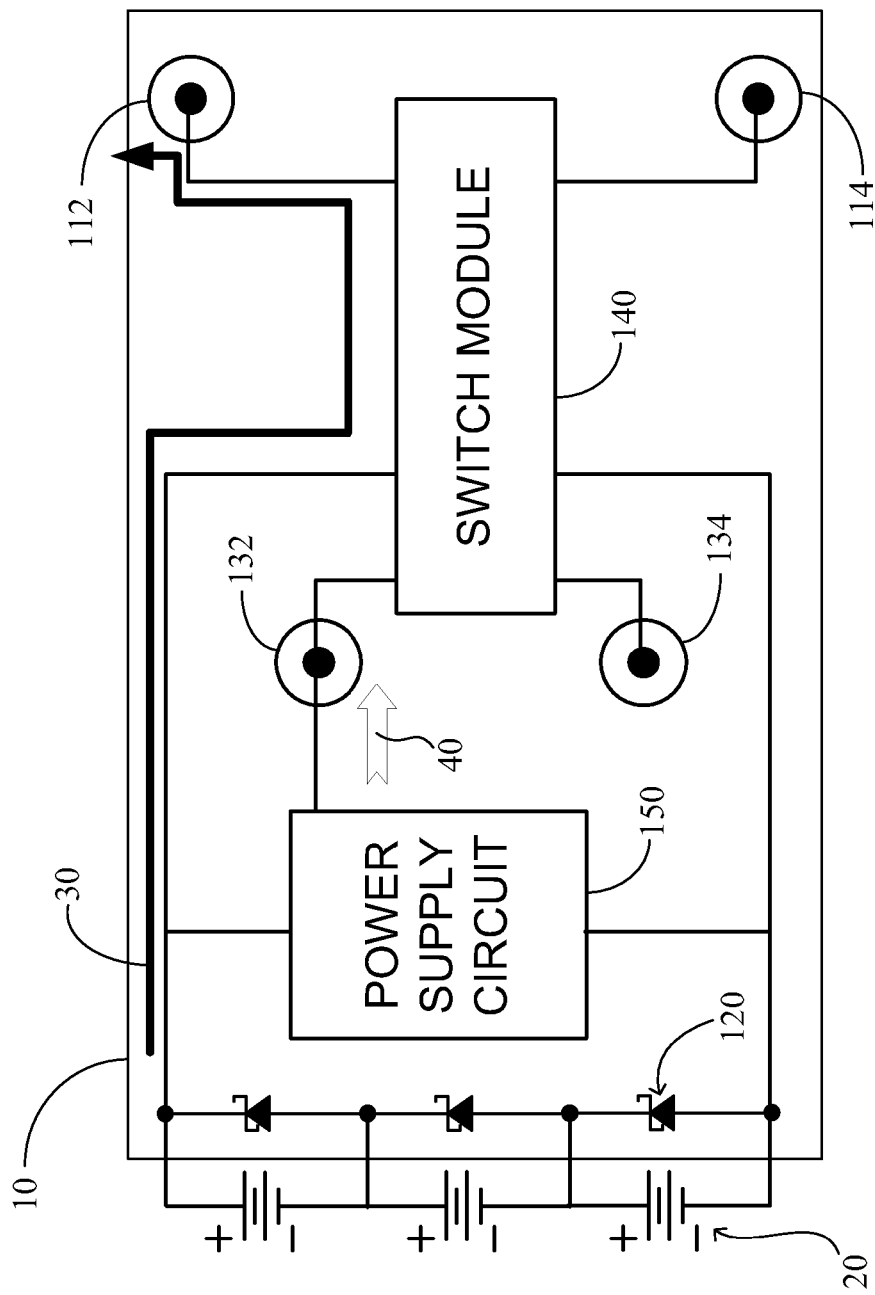
FIG. 1 is a block diagram illustrating circuit of a junction box according to a preferred embodiment of the present invention.

The present invention will now be described in detail with reference to a few preferred embodiments thereof as illustrated in the accompanying drawings. The same reference numerals refer to the same parts or like parts throughout the various figures.

Referring to FIG. 1, FIG. 1 is a block diagram illustrating circuit of a junction box according to a preferred embodiment of the present invention, and the junction box is designated at reference numeral 10. The junction box 10 is utilized to connect a power supply unit 20. The junction box 10 includes a first connection terminal 112, a second connection terminal 114, at least one bypass diode (Bypass Diode) 120, a first signal connection terminal 132, a second signal connection terminal 134, a switch module 140, and a power supply circuit 150. The power supply unit 20 is a solar photovoltaic (PV) panel or a battery unit, which is indicated as a battery symbol.

The first connection terminal 112 and the second connection terminal 114, such as Multi-Contact Ltd.'s MC4 cathode and anode connectors, are used for transmitting a DC power 30 provided by the power supply unit 20. The at least one bypass diode 120, such as a Schottky diode, is utilized to electrically couple to the power supply unit 20 to avoid a reverse voltage for protecting the power supply unit 20.

The first signal connection terminal 132 and the second signal connection terminal 134 are utilized to serially connect to the second signal connection terminal 134 and the first signal connection terminal 132 of another adjacent junction box for transmitting a control signal 40. A power of the control signal 40 can be provided by the power supply unit 20. Specifically, the power supply circuit 150 is electrically coupled to the power supply unit 20, and the power supply circuit 150 is utilized to provide the power of the control signal 40. More specifically, the power supply circuit 150 extracts a part of the power from the power supply unit 20 so as to provide the control signal 40.

The switch module 140 is electrically coupled between the first signal connection terminal 132 and the second signal connection terminal 134. The switch module 140 controls an electrically coupling relationship (i.e., the transmission of the DC power 30) between the first connection terminal 132 and the second connection terminal 134 according to the control signal 40. For example, the control signal 40 can control the connection and disconnection between the first connection terminal 112 and the power supply unit 20 as well as the second connection terminal 114 and the power supply unit 20. When the first connection terminal 112 and the second connection terminal 114 as well as the power supply unit 20 are connected, the DC power 30 can be transmitted to another adjacent junction box 10 via the first connection terminal 112 and the second connection terminal 114. When the first connection terminal 112 and the second connection terminal 114 as well as the power supply unit 20 are disconnected (open), the DC power 30 cannot be transmitted to another adjacent junction box 10 via the first connection terminal 112 and the second connection terminal 114.

Figure 2:
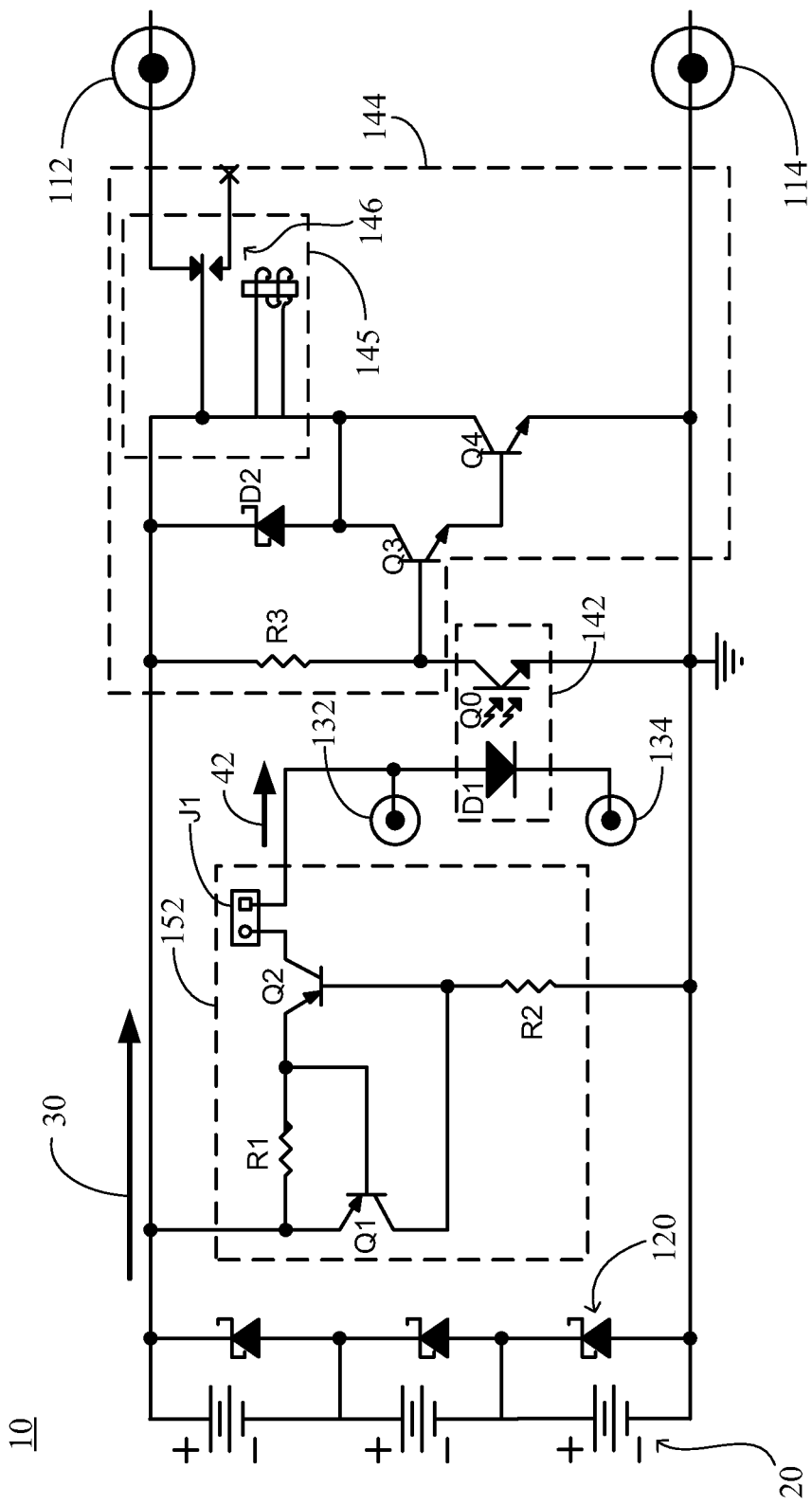
FIG. 2 depicts a detail circuit of the junction box according to the preferred embodiment of the present invention.

The switch module 140 and the power supply circuit 150 according to the preferred embodiment of the present invention will be explained in the following. Referring to FIG. 2, FIG. 2 depicts a detail circuit of the junction box according to the preferred embodiment of the present invention. The above-mentioned power supply circuit 150 is preferably a current-limiting circuit 152. The current-limiting circuit 152 is electrically coupled to the first signal connection terminal 132, and the current-limiting circuit 152 has transistors Q1 and Q2, resistors R1 and R2, and a jumper J1. The current-limiting circuit 152 is utilized for generating a predetermined current 42 to the first signal connection terminal 132 to serve as the control signal 40. A magnitude of the predetermined current 42 is either less than or equal to a predetermined value. Preferably, the predetermined value can be 5 mA, 1 mA, or any suitable current value. The jumper J1 is utilized determine whether the junction box 10 generates the predetermined current 42. For example, when the jumper J1 is disconnected, the current-limiting circuit 152 is unable to transmit the predetermined current 42 to the first signal connection terminal 132, that is, the current-limiting circuit 152 has no effect. When connecting jumper J1, the current-limiting circuit 152 can transmit the predetermined current 42 to the first signal connection terminal 132.

Please continue to refer to FIG. 2, in the embodiment, the above-mentioned switch module 140 includes a photoelectric switch 142 and a power switch 144. The photoelectric switch 142 is disposed between the first signal connection terminal 132 and the second signal connection terminal 134. Preferably, the photoelectric switch 142 is an opto-isolator, which has a LED D1 and a phototransistor Q0.

As shown in FIG. 2, the power switch 144 is a relay circuit which has a relay 145, transistors Q3 and Q4, a resistor R3, and a diode D2. The relay 145 herein has a single pole double throw (SPDT) switch 146. However, the power switch 144 is not limited to be implemented as the relay circuit in the present invention, and the power switch 144 also can be a field effect transistor circuit, such as P-type field effect transistor circuit or N-type field effect transistor circuit. The power switch 144 is electrically coupled to the first connection terminal 112 and the second connection terminal 114. The power switch 144 is used for controlling the connection and the disconnection between the power supply unit 20 and the first connection terminal 112 as well as the power supply unit 20 and the second connection terminal 114.

The photoelectric switch 144 is driven by the predetermined current 42. In the embodiment, the predetermined current 42 can go through the LED D1 for the LED D1 illuminating the phototransistor Q0, thereby making the phototransistor Q0 at a turn-on state. The relay 145 is driven by the phototransistor Q0 for the first connection terminal 112 being electrically coupled to the power supply unit 20. Similarly, the LED D1 does not illuminate if no current goes through it. The phototransistor Q0 is at a turn-off state, which enables a monopole double throw switch 146 of the relay 145 to switch to a floating state. Thus, the first connection terminal 112 is disconnected to the power supply unit 20, so that the junction box 10 and the adjacent junction box 10 are de-serialized.

In summary, except for the switch module 140 being capable of serializing and de-serializing, the switch module 140 of the junction box of the present invention can be controlled without extra power through the power supply unit 20 generating the power of control signal 40.

Figure 3:
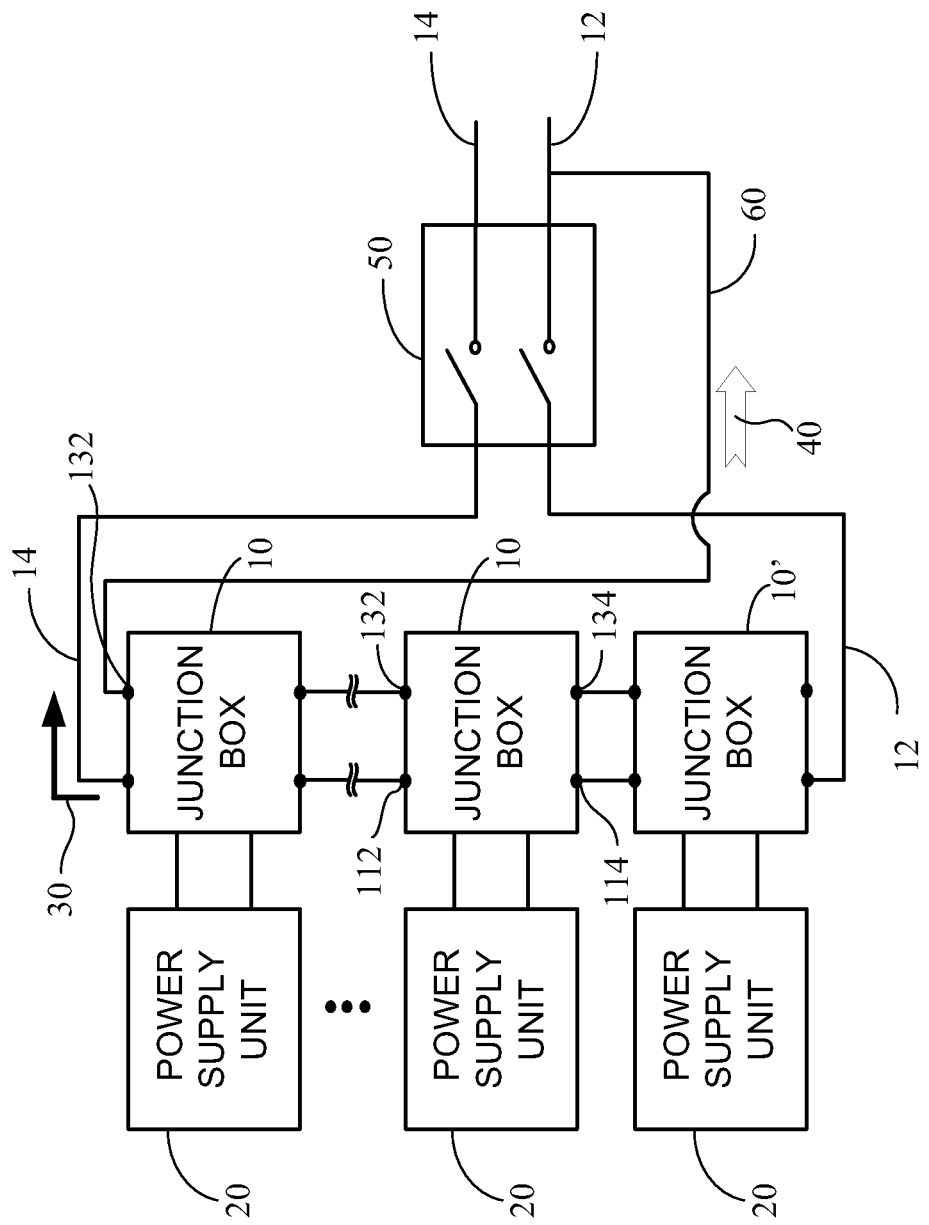
FIG. 3 is a block diagram illustrating a power system according to a preferred embodiment of the present invention.

Referring to FIG. 1 and FIG. 3, FIG. 3 is a block diagram illustrating a power system according to a preferred embodiment of the present invention, and the power system of the preferred embodiment of the present invention is implemented by using the junction box 10 of the above-mentioned embodiment. The power system includes a plurality of power supply units 20, a plurality of junction boxes 10, and a manual breaker 50, and a control wire 60.

The junction boxes 10 are electrically coupled respectively to the power supply units 20, and a first one and a last one of the junction boxes are respectively coupled to a low potential line 12 and a high potential line 14. Preferably, the voltage of the low potential line 12 is a ground voltage, i.e., 0 volt. The power supply units 20 are utilized to output a DC power 30 which is outputted by the low potential line 12 and the high potential line 14 via the first connection terminals 112 and the second connection terminals 114 of the junction boxes 10 in serial connections.

Referring to FIG. 1 again, each junction box 10 includes the first signal connection terminal 132, the second signal connection terminal 134, and the switch module 140 which is electrically coupled between the first signal connection terminal 132 and the second signal connection terminal 134. The first signal connection terminal 132 and the second signal connection terminal 134 are connected to the second signal connection terminal 134 and the first signal connection terminal 132 of the adjacent junction box in serial connections for transmitting a control signal 40 which is powered by the power supply unit 20.

The manual breaker 50 is electrically coupled to ends of the low potential line 12 and the high potential line 14 for simultaneously connecting or disconnecting the low potential line 12 and the high potential line 14. Preferably, an inverter (not shown) can be coupled to the lines behind the manual breaker 50, and the inverter is utilized to convert the DC power 30 into an AC power served as a utility power.

One end of the control wire 60 is electrically coupled to the first signal connection terminal 132 of the last junction box 10, and an opposite end of the control wire 60 is electrically coupled to the low potential line 12 behind the manual breaker 50. The control wire 60 turns on or turns off the transmission of the control signal 40 according to the manual breaker 50. The switch module 140 herein controls a serialization or a de-serialization of the junction boxes 10 according to the transmission of the control signal 40. For example, the control wire 60 turns off the transmission of the control signal 40 to de-serialize the junction boxes 10 when the low potential line 12 is disconnected by the manual breaker 50. The control wire 60 turns on the transmission of the control signal 40 to serialize the junction boxes 10 when the low potential line 12 is connected by the manual breaker 50. It is worth mentioning that the control wire 60 only is used for transmitting the control signal 40 (e.g., the current less than or equal to 5 mA). Thus, the wire diameter of the control wire 60 is less than the low potential line 12 and the high potential line 14 for transmitting the DC power 30.

Specifically, the control signal 40 is provided by the first junction box 10'. Accordingly, the first junction box 10' is designated as a master junction box, and the remaining of the junction boxes are slave junction boxes. Furthermore, referring to FIG. 1 and FIG. 2 again, The first junction box 10' further comprises a power supply circuit 150, and the power supply circuit 150 is electrically coupled to the power supply unit 20 which is coupled to the first junction box 10', and the power supply circuit 150 is utilized to provide the power of the control signal 40. Preferably, the power supply circuit 150 is a current-limiting circuit 152 as shown in FIG. 2. The current-limiting circuit 152 is electrically coupled to the first signal connection terminal 132. The current-limiting circuit 152 is utilized for generating a predetermined current 42 to the first signal connection terminal 132 to serve as the control signal 40.

Actually, both the master junction box and the slave junction box have the power supply circuit 150, e.g. the current-limiting circuit 152. Among the differences between those is that the jumper J1 within the current-limiting circuit 152 of the master junction box is connected, and the jumper J1 of the slave junction box is disconnected. As mentioned above, when connecting jumper J1, the current-limiting circuit 152 can transmit the predetermined current 42 to the first signal connection terminal 132. When disconnecting jumper J1, the current-limiting circuit 152 cannot transmit the predetermined current 42 to the first signal connection terminal 132, that is, the current-limiting circuit 152 has no effect.

Similarly, each switch module 140 includes a photoelectric switch 142 and a power switch 144, as shown in FIG. 2. The photoelectric switch 142 is disposed between the first signal connection terminal 132 and the second signal connection terminal 134. The power switch 144 is utilized to control the serialization or the de-serialization of the corresponding junction box 10 according to an on/off state of the photoelectric switch 142. The photoelectric switch 142 herein is driven by the predetermined current 42. Similarly, the power switch 144 is a relay circuit or a field effect transistor circuit.

In summary, the above-mentioned junction boxes 10 of the present invention is utilized, and the first junction box 10' is set as the master junction box for dispatching the control signal 40, and the remaining of the junction boxes 10 are the slave junction boxes. The switch module 140 within the junction box 10 controls to de-serialize or serialize according to whether the control wire 60 is conducted.

Referring to FIG. 1 to FIG. 4 again, FIG. 4 is a flow chart illustrating a control method of serialization or de-serialization for the power system in accordance with the present invention. What follows is a detail of the control method with respect to the power system of the present invention. The control method according to the present invention is implemented by using the power system of the above-mentioned preferred embodiment. The power system includes a plurality of power supply units 20, a plurality of junction boxes 10 in serial connections, and a manual breaker 50. The first one and the last one of the junction boxes 10 are respectively coupled to the low potential line 12 and the high potential line 14. Each junction box includes the first signal connection terminal 132, the second signal connection terminal 134, and the switch module 140. The first signal connection terminal 132 and the second signal connection terminal 134 are connected to the second signal connection terminal 134 and the first signal connection terminal 132 of the adjacent junction box 10 in serial connections for transmitting the control signal 40. The manual breaker 50 is electrically coupled to ends of the low potential line 12 and the high potential line 14. The descriptions of the same elements have been explained as above mention, so we need not go into detail herein.

Figure 4:
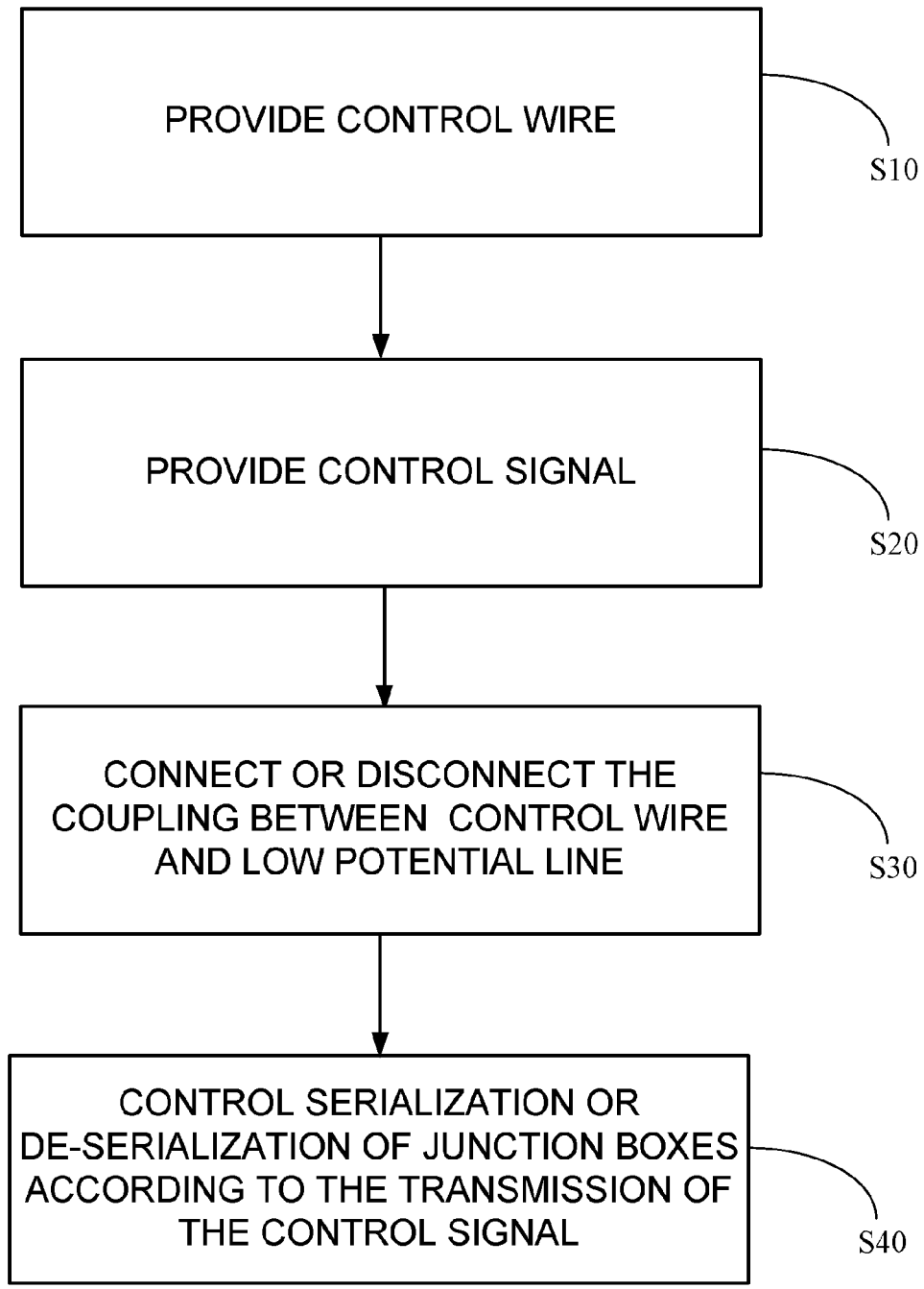
FIG. 4 is a flow chart illustrating a control method of serialization or de-serialization for the power system in accordance with the present invention.

Referring to FIG. 4, the control method begins with step S10.

At step S10, a control wire 60 is provided, one end of which is electrically coupled to the first signal connection terminal 132 of the last junction box 10, and an opposite end of which is electrically coupled to the low potential line 12 behind the manual breaker 50.

At step S20, the corresponding power supply unit 20 of the first junction box 10' provides the power of the control signal 40. For example, the first junction box 10' is a master junction box, which is utilized for generating the predetermined current 42 to the first signal connection terminal 132 of the first junction box 10'.

At step S30, the coupling between the control wire 60 and the low potential line 12 is connected or disconnected. For example, the manual breaker 50 can be controlled to simultaneously connect or disconnect the low potential line 12 and the high potential line 14, thereby connecting or disconnecting the coupling between the control wire 60 and the low potential line 12. In addition, the control wire 60 also can be cut so that the control wire 60 is at a floating state for disconnecting the coupling between the control wire 60 and the low potential line 12. It is worth mentioning that the wire diameter of the control wire 60 is less than the low potential line 12. Preferably, the control wire 60 can be red or other warning colors for a fireman to cut the control wire 60 in case of a fire.

At step S40, the switch module 140 herein controls a serialization or a de-serialization of the junction boxes 10 according to the transmission of the control signal 40. Specifically, when the coupling between the control wire 60 and the low potential line 12 is disconnected in the step S30, the control wire 60 is at a floating state for stopping transmitting the control signal 40 so as to de-serialize. For example, referring to FIG. 3 again, the first signal connection terminal 132 and the second signal connection terminal 134 can not form a close loop with other junction boxes 10 when the control wire 60 is at a floating state. That is, the predetermined current 42 can not go through every photoelectric switch 144 so that each power switch 144 disconnects the coupling between the first connection terminal 112 and the power supply unit 20.

Similarly, when the coupling between the control wire 60 and the low potential line 12 is connected in the step S30, the control wire 60 is grounded for the control signal 40 being transmitted to each of the junction boxes 10 so as to serialize. Similarly, referring to FIG. 3 again, the first signal connection terminal 132 and the second signal connection terminal 134 form a close loop with the first signal connection terminals 132 and the second signal connection terminals 134 of other junction boxes 10 when the control wire 60 and the low potential line 12 are connected, That is, the predetermined current 42 goes through every photoelectric switch 144 so that each power switch 144 connects the coupling between the first connection terminal 112 and the power supply unit 20.

In summary, the control method employs the power system of the present invention as mentioned above. The manual breaker 50 can be utilized to connect or disconnect the control wire 60 so as to simultaneously de-serialize each of the junction boxes 10. Accordingly, the serial connections of each the power supply unit can be de-serialized in case of a fire. The objective that the serial connections of each power supply unit can be de-serialized when an exception occurs can be attained, thereby ensuring the safety of the operator to test or the firemen to put out a fire.

While the preferred embodiments of the present invention have been illustrated and described in detail, various modifications and alterations can be made by persons skilled in this art. The embodiment of the present invention is therefore described in an illustrative but not restrictive sense.

What is claimed is:

1. A power system, comprising:
    a plurality of power supply units;
    a plurality of junction boxes in serial connections electrically coupled respectively to the power supply units, a first one and a last one of the junction boxes respectively coupled to a low potential line and a high potential line, wherein each junction box comprises a first signal connection terminal, a second signal connection terminal, and a switch module electrically coupled between the first signal connection terminal and the second signal connection terminal, the first signal connection terminal and the second signal connection terminal connected to the second signal connection terminal and the first signal connection terminal of the adjacent junction box in serial connections for transmitting a control signal being powered by the power supply unit, wherein the control signal is provided by the first junction box, and wherein the first junction box further comprises a power supply circuit, the power supply circuit is electrically coupled to the power supply unit which is coupled to the first junction box, and the power supply circuit is utilised to extract a part of power from the power supply unit so as to provide the control signal;
    a manual breaker electrically coupled to ends of the low potential line and the high potential line for simultaneously either connecting or disconnecting the low potential line and the high potential line; and
    a control wire having one end electrically coupled to the first signal connection terminal of the last junction box, an opposite end of the control wire electrically coupled to the low potential line behind the manual breaker, the control wire either turning on or turning off a transmission of the control signal according to the manual breaker,
    wherein the switch module controls either a serialization or a de-serialization of the junction boxes according to the transmission of the control signal.

2. The power system of claim 1, wherein the control wire turns off the transmission of the control signal to de-serialize the junction boxes when the low potential line is disconnected by the manual breaker.

3. The power system of claim 1, wherein the control wire turns on the transmission of the control signal to serialize the junction boxes when the low potential line is connected by the manual breaker.

4. The power system of claim 1, wherein the first junction box is a master junction box and remaining of the junction boxes are slave junction boxes, and the master junction box dispatches the control signal to the slave junction boxes.

5. The power system of claim 1, wherein the power supply circuit is a current-limiting circuit being electrically coupled to the first signal connection terminal, and the current-limiting circuit is utilized for generating a predetermined current which is utilized as the control signal to the first signal connection terminal.

6. The power system of claim 5, wherein each switch module comprises:
    a photoelectric switch disposed between the first signal connection terminal and the second signal connection terminal; and
    a power switch utilized to control the serialization or the de-serialization of the corresponding junction box according to an on/off state of the photoelectric switch.

7. The power system of claim 6, wherein the photoelectric switch is driven by the predetermined current.

8. The power system of claim 6, wherein the power switch is either a relay circuit or a field effect transistor circuit.

9. A method for controlling a power system, the power system comprising a plurality of power supply units, a plurality of junction boxes in serial connections, and a manual breaker, a first one and a last one of the junction boxes respectively coupled to a low potential line and a high potential line, each junction box comprising a first signal connection terminal, a second signal connection terminal, and a switch module, the first signal connection terminal and the second signal connection terminal connected to the second signal connection terminal and the first signal connection terminal of the adjacent junction box in serial connections for transmitting a control signal, wherein the control signal is provided by the first junction box, and wherein the first junction box further comprises a power supply circuit, the power supply circuit is electrically coupled to the power supply unit which is coupled to the first junction box, and the power supply circuit is utilized to extract a part of power from the power supply unit so as to provide the control signal, the manual breaker electrically coupled to ends of the low potential line and the high potential line, the method comprising the steps of:
    (1) providing a control wire for one end of the control wire being electrically coupled to the first signal connection terminal of the last junction box and for an opposite end of the control wire being electrically coupled to the low potential line behind the manual breaker;
    (2) providing the control signal by the first junction box through the corresponding power supply unit;
    (3) either connecting or disconnecting the coupling between the control wire and the low potential line; and
    (4) controlling either a serialization or a de-serialization of the junction boxes by the switch module according to the transmission of the control signal.

10. The method of claim 9, wherein when the coupling between the control wire and the low potential line is disconnected in the step (3), the control wire is at a floating state for stopping transmitting the control signal so as to de-serialize.

11. The method of claim 9, wherein when the coupling between the control wire and the low potential line is connected in the step (3), the control wire is grounded for transmitting the control signal to each of the junction boxes so as to serialize.

* * * * *